(12) United States Patent  (10) Patent No.: US 8,535,983 B2
Hin et al.  (45) Date of Patent: Sep. 17, 2013

(54) METHOD OF MANUFACTURING A SEMICONDUCTOR DEVICE

(75) Inventors: Tze Yang Hin, Penang (MY); Stefan Martens, Munich (DE); Werner Simbuerger, Haar (DE); Helmut Wietschorke, Laberweinting (DE); Horst Theuss, Wenzenbach (DE); Beng Keh See, Melaka (MY); Ulrich Krumbein, Rosenheim (DE)

(73) Assignee: Infineon Technologies AG, Neubiberg (DE)

( * ) Notice: Subject to any disclaimer, the term of this patent is extended or adjusted under 35 U.S.C. 154(b) by 33 days.

(21) Appl. No.: 13/152,021

(22) Filed: Jun. 2, 2011

(65) Prior Publication Data

US 2012/0309130 A1 Dec. 6, 2012

(51) Int. Cl.
*H01L 21/56* (2006.01)

(52) U.S. Cl.
USPC .................. 438/113; 438/458; 257/E21.502; 257/E21.599

(58) Field of Classification Search
USPC ........... 438/113, 458; 257/E21.502, E21.599
See application file for complete search history.

(56) References Cited

U.S. PATENT DOCUMENTS

| | | | |
|---|---|---|---|
| 6,669,803 B1 * | 12/2003 | Kathman et al. | 156/250 |
| 7,776,649 B1 * | 8/2010 | Fan | 438/106 |
| 2002/0042189 A1 * | 4/2002 | Tanaka | 438/450 |
| 2004/0097054 A1 * | 5/2004 | Abe | 438/460 |
| 2005/0003636 A1 * | 1/2005 | Takyu et al. | 438/464 |
| 2005/0196939 A1 * | 9/2005 | Lee et al. | 438/460 |
| 2006/0270104 A1 * | 11/2006 | Trovarelli et al. | 438/106 |
| 2007/0212813 A1 * | 9/2007 | Fay et al. | 438/106 |
| 2011/0095413 A1 * | 4/2011 | Barth et al. | 257/685 |
| 2011/0189808 A1 * | 8/2011 | Watanabe et al. | 438/66 |

* cited by examiner

*Primary Examiner* — Alexander Ghyka
*Assistant Examiner* — Stanetta Isaac
(74) *Attorney, Agent, or Firm* — Slater & Matsil, L.L.P.

(57) ABSTRACT

In one embodiment a method for manufacturing a semiconductor device comprises arranging a wafer on a carrier, the wafer comprising singulated chips; bonding the singulated chips to a support wafer, and removing the carrier.

7 Claims, 4 Drawing Sheets

METHOD OF MANUFACTURING A SEMICONDUCTOR DEVICE

TECHNICAL FIELD

The present invention relates generally to a method for manufacturing an electronic component.

BACKGROUND

Electronic component packaging generally is the final stage of semiconductor device fabrication. The electronic component may be incorporated into an individual protective package, mounted with another component or other components in hybrid or multi-component modules or connected directly onto a printed circuit board (PCB).

SUMMARY OF THE INVENTION

In accordance with a preferred embodiment of the present invention, a method for manufacturing a semiconductor device is disclosed. The method comprises arranging a wafer on a carrier, the wafer comprising singulated chips, bonding the chips to a support wafer, and removing the carrier.

In accordance with another embodiment of the present invention, a method for manufacturing a semiconductor device is disclosed. The method comprises placing a wafer on a dicing tape, cutting the wafer into a plurality of chips and placing the dicing tape with the plurality of chips on a carrier. The method further comprises bonding the plurality of chips to contact pads of a support wafer and removing the dicing tape and the carrier from the plurality of chips.

In accordance with another embodiment of the present invention, a method for manufacturing a semiconductor device is disclosed. The method comprises placing a dicing tape with a plurality of singulated chips on a carrier, each chip being spaced apart from its neighboring chips by spacers, and bonding the plurality of singulated chips to contact pads on a support wafer. The method furthermore comprises removing the support wafer from the encapsulation and the plurality of chips, and cutting the encapsulation forming a plurality of the semiconductor devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a method for manufacturing an electronic component. The invention may also be applied, however, to a manufacturing method of other components.

In one embodiment of the invention a wafer comprising singulated chips is bonded to a support wafer having contact pads. The support wafer is heated to a die-bonding temperature. The wafer is pressed onto the support wafer so that bumps arranged on the singulated chips melt and form interconnects having alloys between the singulated chips and the pads.

In one embodiment of the invention the wafer comprises chips and spacers wherein the spacers space apart neighboring chips. The chips may comprise active and/or passive devices and the spacers may be unprocessed semiconductive material. The chips and the spacers are adhered to a foil and the foil is attached to a carrier. The adhesion properties of the foil are changed by heat or light. After bonding the wafer to a support wafer the foil and the spacers may be removed from the chips. The chips are attached to the support wafer. The spaces between the chips on the support wafer provide room for packaging the chips on wafer-level.

In one embodiment of the invention the adhesive property of the foil is changed so that the chips and the spacers are bonded with different adhesive strength to the foil. This allows the bonded chips to be removed from the foil while the spacers are still attached to the foil. The adhesive property may be changed by heat or light.

Embodiments of the invention provide a fast semiconductor manufacturing process using a wafer-to-wafer bonding process. The wafer-to-wafer bonding process is much faster than the conventional die-by-die pick up and attach process. Embodiments of the invention further provide a reliable interconnect between a chip and contact pads. The interconnect may form an alloy from different metallic materials. Embodiments of the invention may save cost because the arrangement of the contact pads on the support wafer provides a cost improvement over conventional leadframes.

Figure 1:
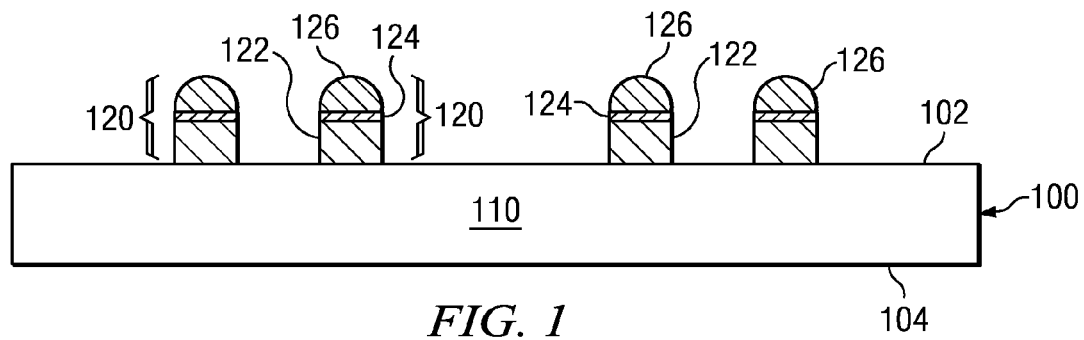
FIG. 1 shows a wafer having bumps formed thereon.

FIGS. 1-9 illustrate a method for manufacturing a semiconductor device. The semiconductor device may be a packaged chip, for example. FIG. 1 shows a wafer 100 comprising a semiconductive substrate. The semiconductive substrate may be silicon, germanium or other semiconductive materials, for example. The wafer 100 may be a compound semiconductor such as GaAs, InP, Si/Ge, or SiC. The wafer may be bulk silicon or silicon on insulator (SOI).

The wafer 100 may be processed to form stand alone devices such as power transistors or radio frequency (RF) devices. Alternatively, the 100 wafer may be processed to form integrated circuits (IC) such as processors, microcontrollers, transceivers, memory devices or the like. In some embodiments the wafer may be processed to form MEMS devices.

The wafer 100 may be processed so that the individual chips are spaced apart by a predetermined distance. The predetermined distance provides space to package the chips on wafer level. Alternatively, the wafer 100 may be processed so that the chips are only separated by a kerf and no additional space.

Bumps 120 may be formed on the wafer 100. The bumps 120 are formed on the wafer 100 in such a way that each chip 110 may comprise at least two bumps 120 and that the spacers 115 do not comprise bumps 120. For example, a chip 110 for a very small leadless package (TSSLP) may have two bumps 120 and a chip 110 for a small leadless package (TSLP) may have six bumps. The chip 110 may comprise a bump 120 for each chip pad arranged on the chip 110.

The bumps 120 may be formed on a first side 102 of the wafer 100. The first side 102 is opposite to a second side 104 of the wafer 100. The first side 102 may be an active side and the second side 104 may be a back side of wafer 100 or vice versa. Alternatively, the bumps 120 may be made on any side of the wafer 100.

The bumps 120 may comprise conductive pillars 122. The conductive pillars 122 may be copper (Cu), gold (Au) or the like. Additionally, the bumps 120 may further comprise an optional intermediate layer 124. The optional intermediate layer 124 is disposed over the conductive pillars 122 and may comprise a conductive material such as nickel (Ni), palladium (Pd), tantalum nitride (TaN) or the like. The bumps 120 may further comprise a solder top 126. The solder top 126 is formed over the optional intermediate layer 124. The solder top 126 may be round or may comprise angles. The bumps 120 may comprise other forms than a pillar form.

The solder top 126 may comprise a reflowable solder. The reflowable solder may be a lead based or a lead free material. The reflowable solder may comprise metals such as tin (Sn), lead (Pb), antimony (Sb), bismuth (Bi), silver (Ag), copper (Cu) or combinations thereof. In one embodiment the reflowable solder consists essentially of tin (Sn) or silver/tin (SnAg).

The bumps 120 may be formed by forming a photoresist over the wafer 100. Openings may be formed in the photoresist and the openings may be used to form the contact pillars 122, the optional intermediate layer 124 and the solder tops 126 of the bump 100. After forming the bumps 120, the remaining portion of the photoresist is removed. Free standing bumps 120 may remain over the wafer 100 as is shown in FIG. 1.

Figure 2:
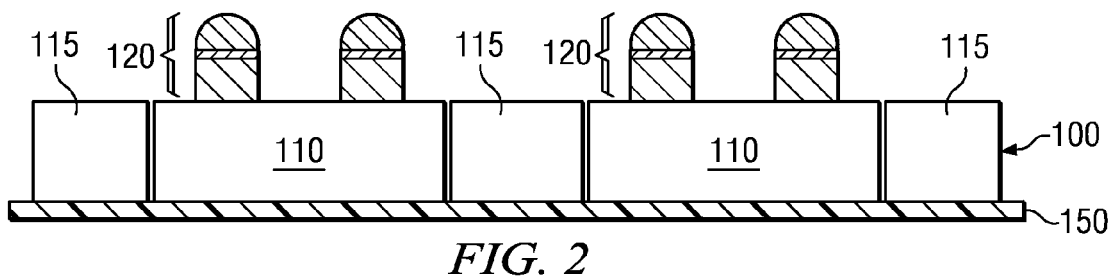
FIG. 2 shows a wafer placed on a dicing tape.

After forming the bumps 120 on the wafer 100, the wafer 100 may be cut. Cutting the wafer 100 may be carried out by placing the wafer 100 on a foil or a dicing tape 150 as shown in FIG. 2. A dicing tape 150 can be a flexible plastic film made of PVC, polyolefin, or polyethylene backing material with an adhesive to hold the chips or dice in place. The dicing tape 150 is available in a variety of thicknesses, from about 75 µm to about 350 µm, with a variety of adhesive strengths, designed for various chip sizes and materials. The wafer 100 is cut by mechanical sawing, by laser cutting or plasma dicing. The cut wafer 100 comprises a plurality of chips on the dicing tape 150.

In one embodiment the dicing tape 150 may be a UV tape in which the adhesive bond is broken or substantially reduced by exposing the dicing tape 150 to UV light after dicing, allowing the adhesive bond to be strong during the cutting process but weakening the adhesive bond after the cutting process. Weakening the adhesive bond allows a clean and easy removal of the dicing tape 150 from the bonded chips 110. In one embodiment the adhesive property of the UV tape is changed over the chips 110 but not over the spacers 115 by using a masking UV exposure.

In one embodiment the dicing tape 150 may be a thermal release tape in which the adhesive bond is broken or substantially reduced by exposing the dicing tape to thermal energy. In one embodiment the adhesive property of the thermal release tape is changed over the chips 110 but not over the spacers 115 by using selective area heating.

Figure 3:
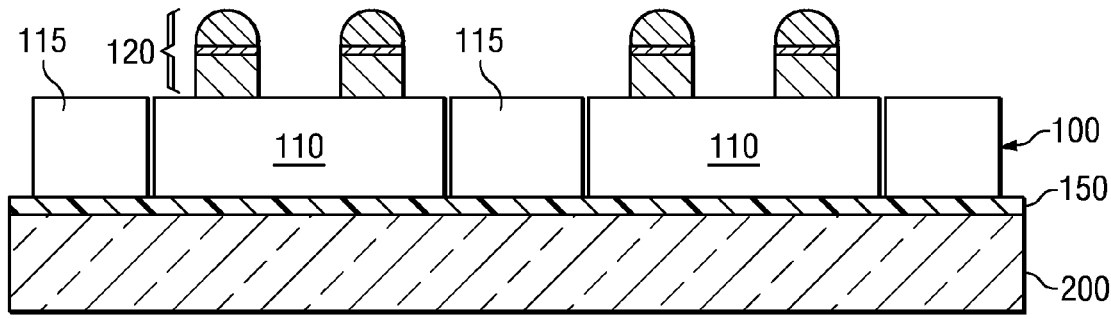
FIG. 3 shows a wafer and a dicing tape placed on a carrier.

Turning now to FIG. 3, the cut wafer is attached to a carrier 200. The carrier 200 may be made from a transparent material to allow alignment between the wafer 100/carrier 200 and the support wafer 300 as shown in FIG. 3. The transparent material may comprise glass, plastic, quartz, or another optically transparent material. Alternatively the carrier 200 may be made from silicon or another material which is transparent to infrared light. The sawn wafer 100 may be attached to the carrier 200 with a thin layer of glue or with a double-sided adhesive foil. The cut wafer 100 and the carrier 200 may then be flipped. In one embodiment the cut wafer 100 is flipped before it is attached to the carrier 200.

Figure 4:
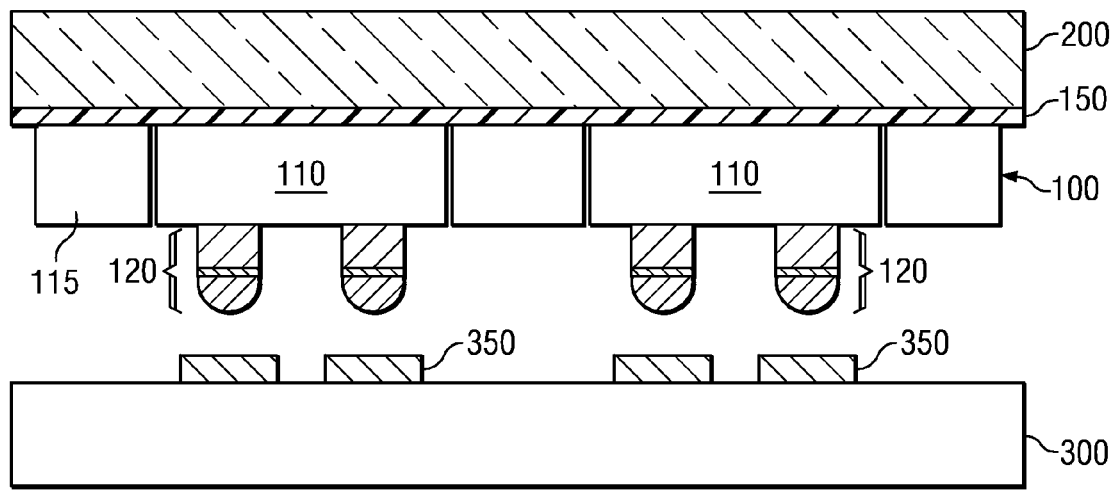
FIG. 4 shows the flipped wafer and a support wafer.

FIG. 4 shows the sawn wafer 100 ready for bonding to a support wafer 300. The support wafer 300 may be a semiconductive substrate such as silicon, germanium or the like. In one embodiment the support substrate 300 may be a metal or a combination of metals. For example, a suitable metal may be copper (Cu) or nickel (Ni). In one embodiment the support substrate 300 may be made from a polymer such as Polytetrafluorethylen (Teflon).

Conductive pads 350 may be formed on the support substrate 300. For example, the conductive pads 350 may be copper (Cu) or nickel (Ni). The conductive pads 350 may be plated with silver (Ag), gold (Au), or a combination of metals including palladium (Pd). In one example, the conductive pads 350 may be silver nickel (NiAg). The conductive pads may be formed with a simple mask (e.g., photoresist) process on the support substrate 300. The conductive pads 350 may be plated, sputtered, evaporated or otherwise formed on the support substrate 300.

Figure 5:
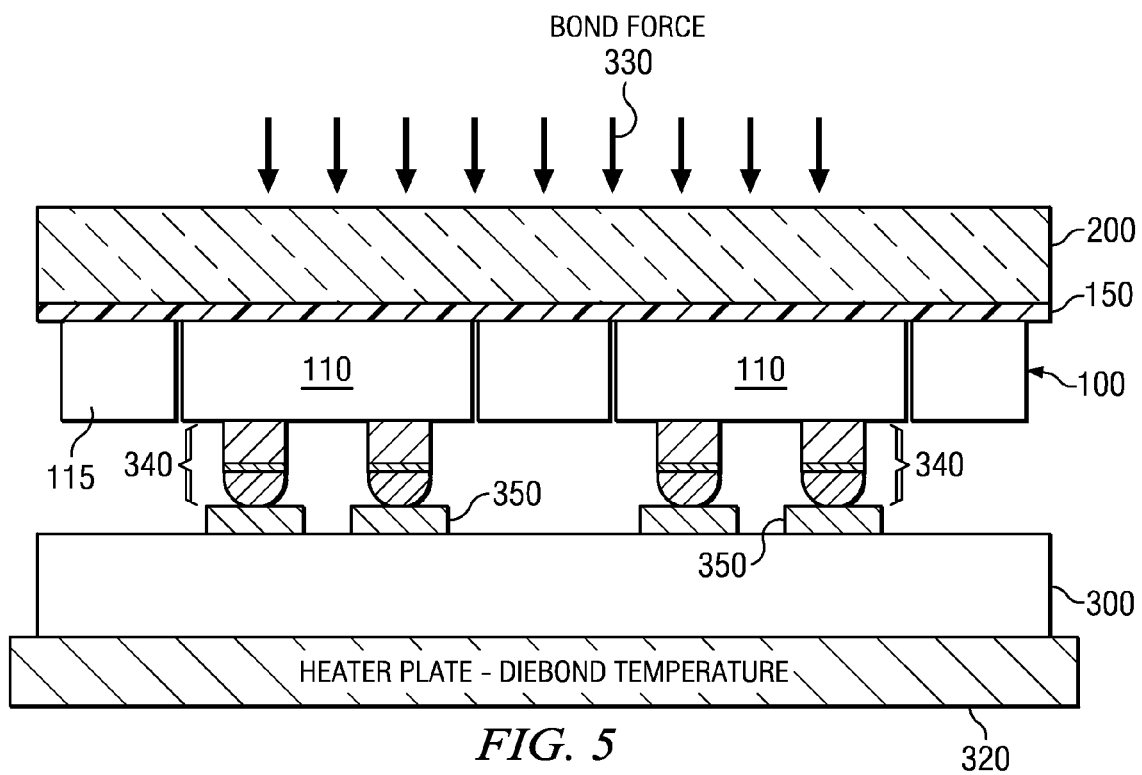
FIG. 5 shows the wafer being bonded to the support wafer.

The support wafer 300 may be placed on a heater plate 320 as shown in FIG. 5. The heater plate 320 heats the support wafer 300 to a die-bond temperature. For example, the heater plate 320 may heat the support wafer 300 to a temperature between about 180 C and about 350 C. Alternatively, the support wafer 300 may be heated by irradiation (not shown). The carrier 200 with the cut wafer 100 is pressed against the support wafer 300. The bumps 120 on the chips 110 are pressed against the conductive pads 350 of the support wafer 300 by applying a bonding force 330. The carrier 200 is pressed against the support wafer 300 with a bonding force 330 for a certain amount of time. For example, the pressure may be about 5 g/mm² to about 500 g/mm² and the bonding time may be about 10 ms to about 1 s depending on the die size of the chips.

By pressing the bumps 120 on the bonding pads 350 the solder tops 126 of the bumps 120 melt and material of the conductive pillar 122 and/or the bonding pads 350 diffuse into the melting solder forming at least one alloy. The alloys may be binary or ternary alloys. The alloys solidify and form stable and reliable interconnects 340.

In one embodiment the interconnect 340 may comprise a copper pillar 122, a binary tin/silver (Sn/Ag) alloy layer near the contact pad 350 and a binary copper/tin (Cu/Sn) alloy layer around the tip of the copper pillar 112 and above the binary tin/silver (Sn/Ag) alloy layer. A ternary a copper/tin/silver (Cu/Sn/Ag) alloy layer may be formed between the binary tin/silver (Sn/Ag) alloy layer and the binary copper/tin (Cu/Sn) alloy layer (not shown).

The conductive pad 350 may comprise nickel (Ni) plated with silver (Ag). The silver plating layer may be about 1 µm to about 4 µm thick, the silver/tin (Ag/Sn) alloy layer may be about 1 µm to about 10 µm thick, and the copper/tin (Cu/Sn) alloy layer may be about 1 µm to about 10 µm thick. The thickness of the alloy layers may be dependent on the temperature budget, e.g., the thickness of the alloy layers may increase if the heating time increases.

In one embodiment the interconnect 340 may comprise a copper pillar 112, a binary tin/gold (Sn/Au) alloy layer near the contact pad 350 and a binary copper/tin (Cu/Sn) alloy layer formed below or around the tip of the copper pillar 112 and above the binary tin/gold (Sn/Au) alloy layer. A ternary a copper/tin/gold (Cu/Sn/Au) alloy layer may be formed between the binary tin/gold (Sn/Au) alloy layer and the binary copper/tin (Cu/Sn) alloy layer. The tin gold (Sn/Au) alloy layer may be $Au_5Sn$ or $AuNiSn_2$ if the gold (Au) plating is fully consumed. The contact pad 350 is nickel (Ni) plated with gold (Au).

In one embodiment the interconnect 340 may comprise a copper pillar 112 and two copper/tin (Cu/Sn) alloy layers. The first binary copper/tin (Cu/Sn) alloy layer is formed near the contact pad 350 and the second binary copper/tin (Cu/Sn) alloy layer is formed below or around the tip of the copper pillar 112 above the first binary copper/tin (Cu/Sn) alloy layer. The contact pad 350 is copper (Cu) or a copper (Cu) plated pad.

In one embodiment the neighboring chips 110 on the wafer 100 may be spaced apart by a predetermined distance or a spacer 115. For example, the spacer 115 between two chips 110 may be unprocessed silicon and/or may not comprise bumps. In one example the width of the spacer 115 is about 100 μm while the width of the chip 110 may be about 100 μm to several mm. The spacers 115 may provide the opportunity for a wafer level bonding of the chips.

Figure 6:
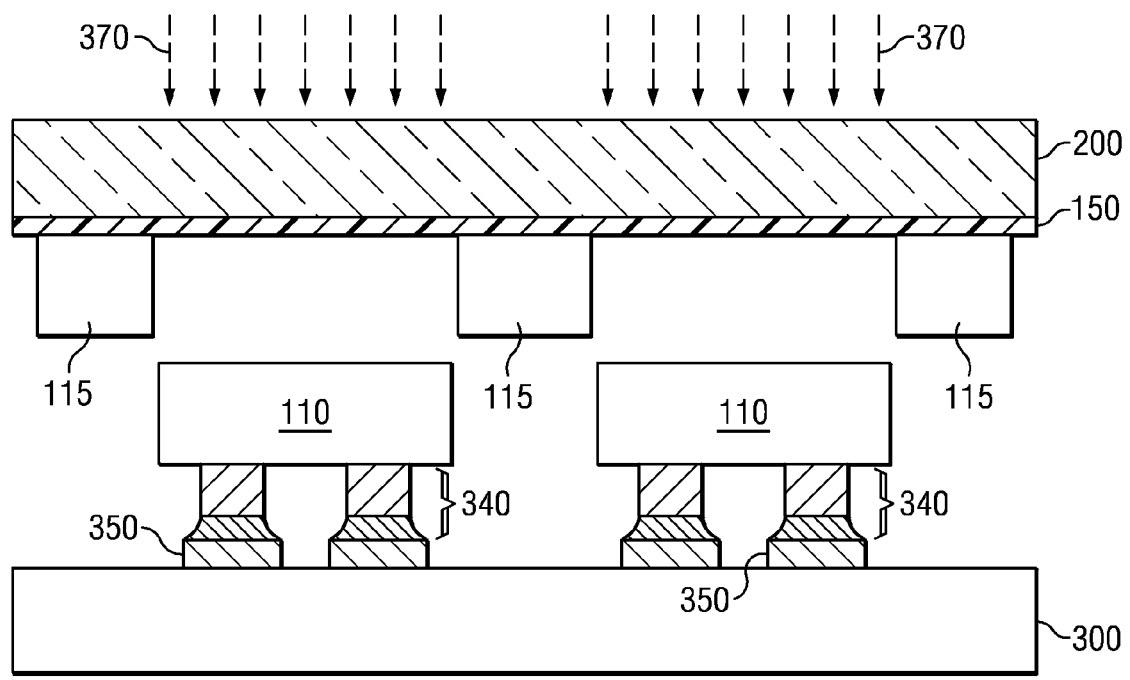
FIG. 6 shows the removal of the carrier from the chips.

Upon completion of the bonding process, the carrier 200 and the dicing tape 150 is removed leaving the chips 110 connected to the support wafer 300. In one embodiment the carrier 200, the dicing tape 150 and the spacer 115 are removed from the chips 110. Before the dicing tape 150 and the chips can be separated the dicing tape 150 may be treated in order to change the adhesion property of the dicing tape 150. In one embodiment the adhesion property of the dicing tape 150 is lowered with an UV treatment 370 of the dicing tape 150 as shown in FIG. 6. In another embodiment the adhesion property of the tape 150 is lowered with a heat treatment 370. The dicing tape 150 may only be selectively treated so that the adhesion property of the dicing tape 150 at the chip 110 locations is lowered while the adhesion property of the dicing tape 150 at the spacer 115 locations is not or lowered. Alternatively, the dicing tape 150 may be selectively treated so that the adhesion property of the spacer 115 locations is increased while the adhesion property of the of the chip 110 location remain the same or is lowered. The carrier 300, the dicing tape 150 and the spacers 115 may be removed with a wafer de-mounter.

Figure 7:
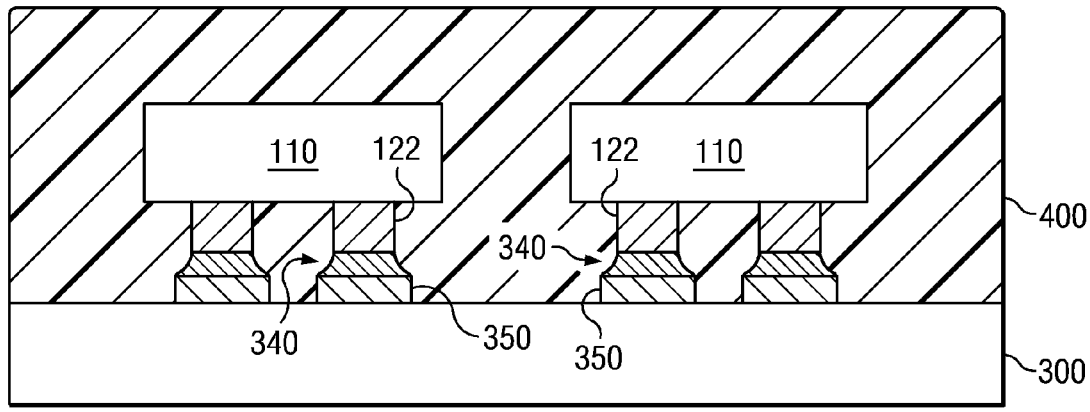
FIG. 7 shows encapsulated chips on the support wafer.

After the carrier 200 is removed from the chips 110 a molding compound 400 is deposited over the support wafer 300 and the chips 110. The molding compound 400 may encapsulate the chips 110 as shown in FIG. 7. The molding compound 400 may be an electrically insulating adhesive. For example, the molding compound 400 may be an epoxy resin or an epoxy resin filled with silicon oxide filler.

Figure 8:
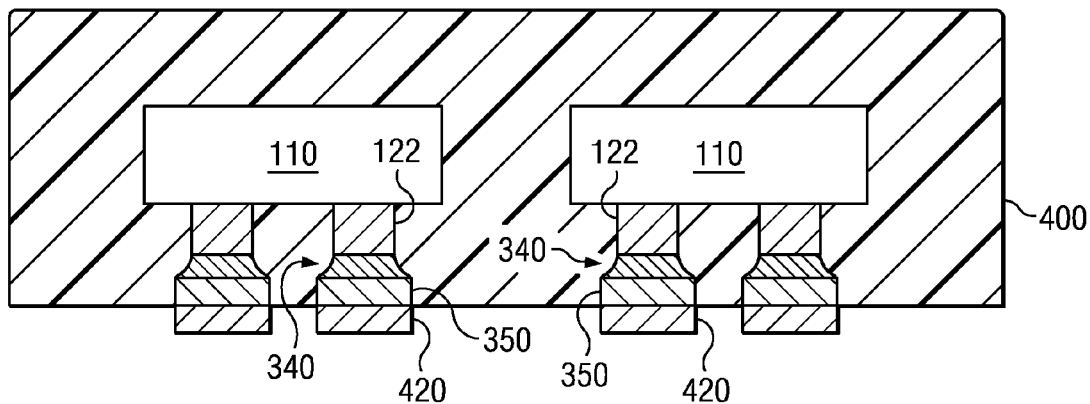
FIG. 8 shows encapsulated chips without the support wafer.

FIG. 8 shows the removal of the support wafer 300 from the chips 110 and the molding compound 400. The removal of the support wafer 300 may expose the bonding pads 350. In one embodiment the support wafer 300 may be removed using a wet etch. For example, the wet etch may comprise $HNO_3$, $H_2O$ and HF or KOH, $H_2O$ and HF for single crystal silicon. In one embodiment the support wafer 300 may be removed using a dry etch. For example, the dry etch may comprise $SF_6$, $CF_4$, $CHF_3$, HBr, $Cl_2$ and the like. In one example, nickel (Ni) or copper (Cu) may be etched with NH3. Alternatively, the support wafer 300 may be removed by grinding.

The exposed bonding pads 350 may be covered with a material layer 420. The material layer 420 may be used as a solder attach of the packaged device and a motherboard in a later process step. For example, the material layer 420 may be deposited or plated on the bonding pads 350. The material layer 420 may comprise a noble metal such as gold (Au), silver (Ag) or the like.

Figure 9:
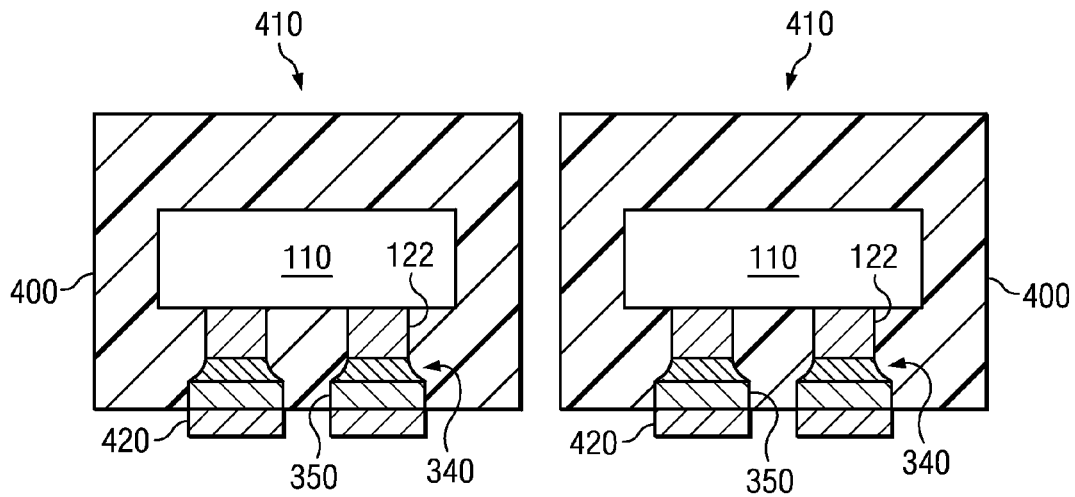
FIG. 9 shows the packaged chips.

In FIG. 9, the chips 110 encapsulated in the molding compound 400 are again placed on or laminated with a dicing tape (not shown). The chips 110 including the encapsulation are then singulated or separated using a cutting process. The encapsulated chips 110 are separated by mechanical sawing, by laser cutting or plasma dicing, for example. The encapsulated chips 110 may or may not be flipped before the cutting operation. The dicing tape is removed. The cutting operation may form packaged chips 410 comprising an individual chips 110. For example, the packaged chips which are produced according to the above described process may be small leadless package (TSLP) or a very small leadless package (TSSLP)

In other embodiments, the package 410 produced may be a module comprising several chips 110. For example, the package 410 may comprise two different chips 110, i.e. two different discrete chips, two different integrated circuit chips, or one discrete chip and one integrated circuit chip (not shown).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing semiconductor devices, the method comprising:
    placing a dicing tape with a plurality of singulated chips onto a carrier, each chip being spaced apart from its neighboring chips by spacers;
    bonding the plurality of singulated chips to contact pads on a support wafer;
    removing the dicing tape and the carrier from the plurality of singulated chips but not from the spacers;
    forming an encapsulation for the plurality chips by depositing a molding compound over the support wafer and around the plurality of chips;
    removing the support wafer from the encapsulation and the plurality of chips; and
    cutting the encapsulation forming a plurality of the semiconductor devices.

2. The method according to claim 1, wherein each semiconductor device of the plurality of the semiconductor devices comprises one chip of the plurality of chips.

3. The method according to claim 1, wherein each chip of the plurality of chips comprises at least two pillar bumps.

4. The method according to claim 3, wherein bonding the plurality of singulated chips to the contact pads on the support wafer comprises heating the support wafer and pressing the at least two pillar bumps onto one contact pad.

5. The method according to claim 1, wherein removing the dicing tape from the plurality of singulated chips comprises changing an adhesion property of the dicing tape before removing the dicing tape and the carrier from the plurality of singulated chips.

6. The method according to claim 5, wherein changing the adhesion property of the dicing tape applying a UV treatment.

7. The method according to claim 5, wherein changing the adhesion property of the dicing tape comprises applying a heat treatment.

* * * * *